(12) United States Patent
Xie et al.

(10) Patent No.: US 9,039,851 B2
(45) Date of Patent: May 26, 2015

(54) METHOD OF MANUFACTURING A CARD

(75) Inventors: Xueli Xie, Beijing (CN); Zheng Zhang, Beijing (CN); Jixiang Guo, Beijing (CN); Taoling Xie, Beijing (CN)

(73) Assignee: Hierstar Limited, Chaoyang District (CN)

( * ) Notice: Subject to any disclaimer, the term of this patent is extended or adjusted under 35 U.S.C. 154(b) by 143 days.

(21) Appl. No.: 13/254,141

(22) PCT Filed: Nov. 23, 2009

(86) PCT No.: PCT/CN2009/001344
§ 371 (c)(1),
(2), (4) Date: Sep. 27, 2011

(87) PCT Pub. No.: WO2010/099642
PCT Pub. Date: Sep. 10, 2010

(65) Prior Publication Data
US 2012/0103508 A1    May 3, 2012

(30) Foreign Application Priority Data
Mar. 6, 2009 (CN) .......................... 2009 1 0079287

(51) Int. Cl.
*B29C 65/00* (2006.01)
*B29C 65/48* (2006.01)
*G06K 19/077* (2006.01)
*G06K 19/07* (2006.01)

(52) U.S. Cl.
CPC .......... *G06K 19/077* (2013.01); *Y10T 156/1075* (2015.01); *G06K 19/072* (2013.01); *G06K 19/07703* (2013.01); *G06K 19/07745* (2013.01); *H01L 2924/0002* (2013.01)

(58) Field of Classification Search
CPC ........ B29C 65/48; B29C 65/70; B31D 1/021; G06K 19/072; G06K 19/077; G06K 19/07703; G06K 19/07745; H01L 2924/0002; Y10T 156/1075
USPC .................................. 156/250, 252, 253, 256
See application file for complete search history.

(56) References Cited

U.S. PATENT DOCUMENTS

| | | | | |
|---|---|---|---|---|
| 3,444,732 A * | 5/1969 | McKinley et al. | ........... | 73/150 A |
| 3,826,701 A * | 7/1974 | Miller | ........... | 156/359 |
| 3,925,139 A * | 12/1975 | Simmons | ........... | 156/358 |
| 4,824,498 A * | 4/1989 | Goodwin et al. | ........... | 156/71 |
| 6,058,017 A * | 5/2000 | Horejs et al. | ........... | 361/737 |
| 6,772,953 B2 * | 8/2004 | Iiyama et al. | ........... | 235/492 |
| 6,773,539 B2 * | 8/2004 | Mertens et al. | ........... | 156/277 |
| 2002/0154530 A1 * | 10/2002 | Iwasaki et al. | ........... | 365/63 |
| 2006/0226240 A1 * | 10/2006 | Singleton | ........... | 235/492 |
| 2006/0282385 A1 * | 12/2006 | Cheng et al. | ........... | 705/50 |
| 2007/0169303 A1 * | 7/2007 | Hart | ........... | 15/257.06 |

* cited by examiner

*Primary Examiner* — Mark A Osele
*Assistant Examiner* — Christopher C Caillouet
(74) *Attorney, Agent, or Firm* — Stites & Harbison PLLC; Cong Ding

(57) ABSTRACT

The present invention discloses a method of manufacturing a (plastic) card with a flexible inlay. Said method comprises following steps: manufacturing a upper housing and a lower housing; coating colloidal on inner surfaces of the upper housing and the lower housing; placing the inlay in said upper housing or the lower housing; closing the upper housing and the lower housing together to have a housing-closed card; laminating the closed housings to have a finished card. Preferably, there is provided in either the upper housing or the lower housing a slot(s) in match with the inlay(s); the inlay is placed within the slot accordingly. By means of the invention, a card with flexible inlay is manufactured, for example, an intelligent card (i.e., smart card) comprising a flexible and active circuit board and a flexible display, and properties of a new kind of card with flexible inlay are guaranteed.

18 Claims, 3 Drawing Sheets

METHOD OF MANUFACTURING A CARD

TECHNICAL FIELD

The present invention relates to technical field of card, in particularly to a method of manufacturing a card with flexible inlay.

TECHNICAL BACKGROUND

In a traditional package and manufacture process of card (such as intelligent card), a hot lamination, typically at a temperature of about 135° C. and a pressure of about 5-6 MPa, was conducted to a plastic film such as PVC(Polyvinylchloride) or PET(polyester) so as for the plastic film to integrate together firmly. However, this kind of manufacture process for card cannot be applied directly to a new card with flexible inlays, for example, a new intelligent card having intelligent card chip(s), flexible input equipment, etc, installed on a flexible board and flexible battery(s), as published in Chinese patent application 200910077144.6 of the same applicant as this application, the title of which is "an intelligent card (smart card) and an identification authentication method of intelligent card (smart card) users." Electric components and flexible display installed in the intelligent card are liable to damage at high temperature and high pressure. Additionally, due to difference in physical properties between material of the components and display and the material of the card itself, it is hard to combine the components and the display with the plastic material such as PVC. Conventionally, it remains a problem to manufacture the card with flexible inlays (such as flexible active board and flexible display), especially the new intelligent card with flexible inlay meeting the standard of ISO7816/ISO7810. No technical solution for manufacture of the new card with flexible inlay, especially for batch production of the new intelligent card with flexible inlay, has yet been disclosed up to now.

SUMMARY OF THE INVENTION

Since no feasible solution is available in the prior art for manufacturing the new card production comprising therein flexible components such as flexible active board and flexible display, the invention provides a method of manufacturing a card, including the following steps:

1) manufacturing a upper housing and a lower housing;
2) coating colloidal on inner surfaces of the upper housing and the lower housing;
3) placing an inlay or inlays in either the upper housing or the lower housing, and closing the upper housing and the lower housing together to get a housing-closed card;
4) laminating the housing-closed card to get a finished card.

Further, there is a slot or slots in match with the inlays in the upper housing and/or in the lower housing; wherein the step of placing comprises placing each inlay in a respective slot of the upper housing or the lower housing.

In one embodiment, conduct hot rolling to sheet material of synthetic resin or plastic to make the slots in match with said card inlays.

In another embodiment, the sheet material of synthetic resin or plastic is milled to make each slot in match with a respective card inlay.

In yet another embodiment, conduct injection molding to plastic material to make the upper housing and the lower housing having the slots in match with said card inlays.

The present invention discloses a method of manufacturing a (plastic) card. At first, a upper housing and a lower housing are manufactured, a flexible inlay or flexible inlays are packaged in the upper housing and/or the lower housing, and the upper housing and the lower housing are closed together. Laminating the housing-closed card at a moderate temperature to achieve a card with flexible inlay. The card may be an intelligent card with flexible active board and flexible display. Properties of the new card product with flexible inlay are guaranteed, offering a good manufacture base for massive application of new intelligent cards.

DESCRIPTION OF THE DRAWINGS

Embodiments of the present invention will be described in more details with reference to the drawings, in which.

SPECIFIC MODES FOR CARRYING OUT THE INVENTION

According to the present invention, a upper housing and a lower housing are manufactured firstly. An inlay or inlays are placed in the upper housing and/or the lower housing. The upper housing and the lower housing are closed together to finish the manufacture of the card. The technical solution of the present invention will be discussed in details in the following paragraphs by reference to the drawings and specific mode for carrying out the invention, taking the new intellectual card in accordance with the ISO7816/7810 for example.

Figure 5:
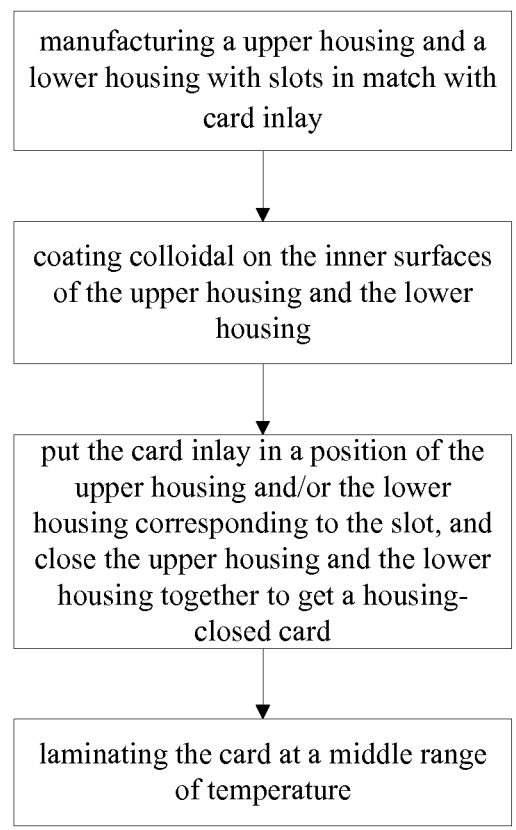
FIG. 5 is a manufacture flow chart of card according to an embodiment of the present invention.

FIG. 5 is a flow chart of manufacturing the card. As shown in the FIG. 5, the method of manufacturing a card according to the invention includes following steps 1-4:

Step 1) manufacturing the upper housing and the lower housing with slots in match with card inlay(s). There are three manufacture methods.

Figure 1:
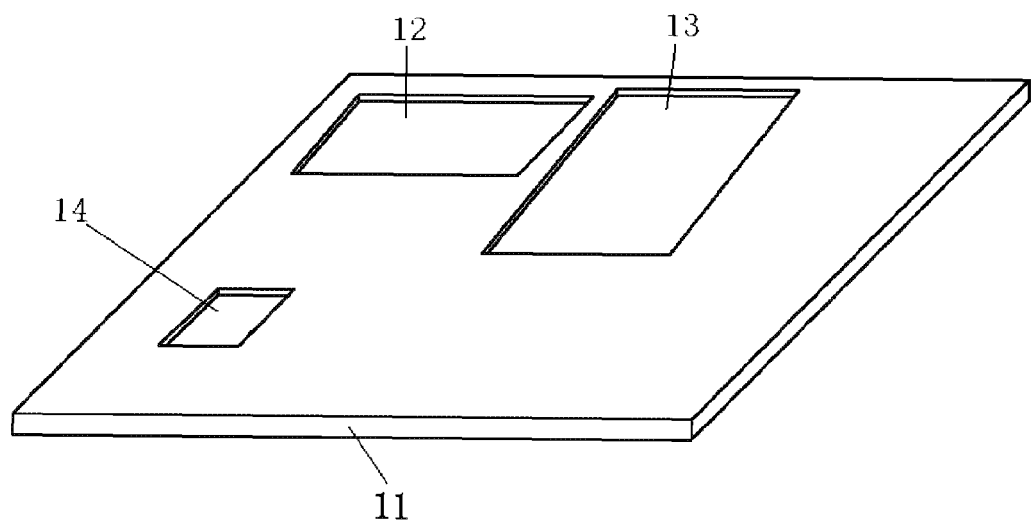
FIG. 1 is a structural schematic representation of a upper housing according to an embodiment of the present invention.
Figure 2:
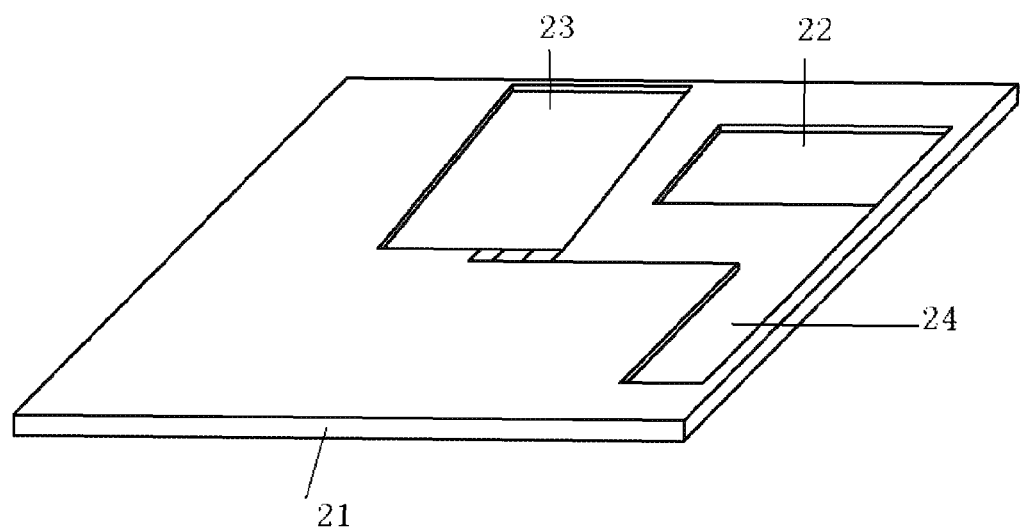
FIG. 2 is a structural schematic representation of a lower housing according to an embodiment of the present invention.

Method 1:

Prepare sheet material made of synthetic resin or plastic, such as PVC(Polyvinylchlorid),PC(Polycarbonate), PETG (Polyethylene Terephtalate Glycol), PET(polyester) or ABS (Acrylonitrile-butadiene-styrene copolymer). Process said sheet material by hot rolling to form a slot or slots, the dimension of which is in match with a respective one of the card inlays, thereby achieve a upper housing and a lower housing with slot(s) in match with the card inlay(s). FIG. 1 is a structural schematic representation of the upper housing while FIG. 2 is a structural schematic representation of the lower housing. In FIG. 1 and FIG. 2, reference sign 11 refers to the upper housing, reference sign 21 refers to the lower housing, reference sign 12 refers to a clearance notch for installation of a card inlay such as a flexible display in the upper housing, reference sign 22 refers to a clearance notch for installation of a card inlay such as a flexible display in the lower housing; reference sign 13 refers to a clearance notch for installation of a card inlay such as a flexible battery in the lower housing; reference sign 14 refers to a clearance notch for installation of a card inlay such as flexible button(s) in the upper housing, reference sign 24 refers to a clearance notch for installation of a card inlay such as flexible button(s) and flexible board in the lower housing.

Method 2:

Prepare a sheet material made of synthetic resin or plastic, for example: PVC, PC, PETG, PET or ABS, etc. Use a milling machine or an engraving machine to mill said sheet material to prepare a slot or slots in match with card inlay(s), thereby achieving a upper housing and a lower housing with slots in match with the card inlay. The length and/or width of the milled slots can be decided based on length/width of components of the inlays, and the depth of the milled slots can be decided based on the height of the components of the inlay.

Method 3:

Injecting directly plastic material into an injection mold to get a upper housing and a lower housing with slots in match with dimensions of a card inlay. Thinnest thickness for sheet production by using an ordinary injection mold is 0.18 mm. In addition, when injection molding with respect to a card product embedded therein with components such as flexible battery and flexible display, thickness in different positions may vary. The part of plastic layer in front and bottom corresponding to the flexible display is thin, and may have a thickness of 0.1 mm or less at a minimum; the part of plastic layer in the front and bottom corresponding to the flexible battery is thin too. In a preferred embodiment, an exhaust steel material or sub-frame inlay structure may be adopted in injection molding the thin part of plastic layer, which assists let-out of exhaust in the thin injection area, establishes a smooth passage for exhaust in mould frame, achieves a minimum colloidal resistance and ensures a smooth flow.

After finishing the injection using ordinary injection mold and ejecting the injection production from the mold, an ejector moulage may appear. In a preferred embodiment, in order to avoid the ejector moulage in the card, a pneumatic structure of the card ejection may be used in the injection mold, and two kinds of pneumatic structure can be used: air vents and funnel blowing structure.

Step 2) coating colloidal on the inner surfaces of the upper housing and the lower housing.

Material of the card inlay may be different from material of the upper housing and the lower housing. The affinity between the different materials should be taken into consideration to avoid detachment of the card inlay from the upper housing and the lower housing, and thereby a bulging phenomenon. Material such as mastic coatings may be used to enhance the affinity between the material of the card inlay and the material of the upper housing and the lower housing. Additionally, since different components in the card inlay may have different height and tolerance, it is difficult for the inlay to make a perfect match with both the upper housing and the lower housing, and thus a filler such as the colloidal may be needed to fill in intervals between the inlay and upper housing and the lower housing.

Figure 3:
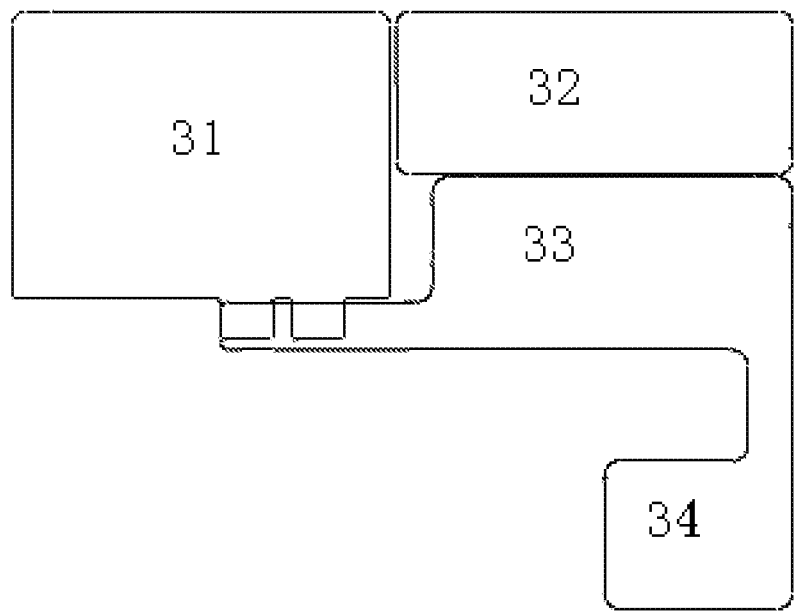
FIG. 3 is a structural schematic representation of a card inlay according to an embodiment of the present invention.

FIG. 3 is a structural schematic representation of the card inlay. The inlay has different components such as battery, flexible board and flexible display, which shall be combined with the upper housing and the lower housing. In FIG. 3, reference sign 31 refers to a flexible battery, reference sign 32 refers to a flexible display, reference sign 33 refers to a flexible board, reference sign 34 refers to a flexible button. The colloidal as selected should have a vitreous transition temperature of 35-70° C. and can be solidified by photo polymerization. Epoxy or thermoplastic polyurethane can be used as the colloidal. Battery and chips within the inlay will not be badly affected when epoxy has a vitreous transition temperature under 70° C.

In an embodiment, colloidal is coated by automatic dispenser or automatic spraying machine to the inner surfaces of the upper housing and the lower housing. The dispensing or spray may be conducted in uniform spacing and in either strip or dot. The dispenser machine can control accurately amount of the colloidal and coating position of the colloidal.

In a preferred embodiment, after the step of coating, a flexible roller may be used to smooth out the coated colloidal. The aim of the smoothing is to spread out the colloidal strip uniformly, and to avoid bubble in following processes. The bubble may lead to uneven surface of finished card product.

After the smoothing, vacuum the upper housing and the lower housing coated with colloidal in order to eliminate bubbles further.

Step 3) after coating the colloidal on the upper housing and the lower housing and performing the smoothing and vacuuming accordingly, put the card inlay in a position of the upper housing and/or the lower housing corresponding to the slot, and close the upper housing and the lower housing together to get a housing-closed card.

Figure 4:
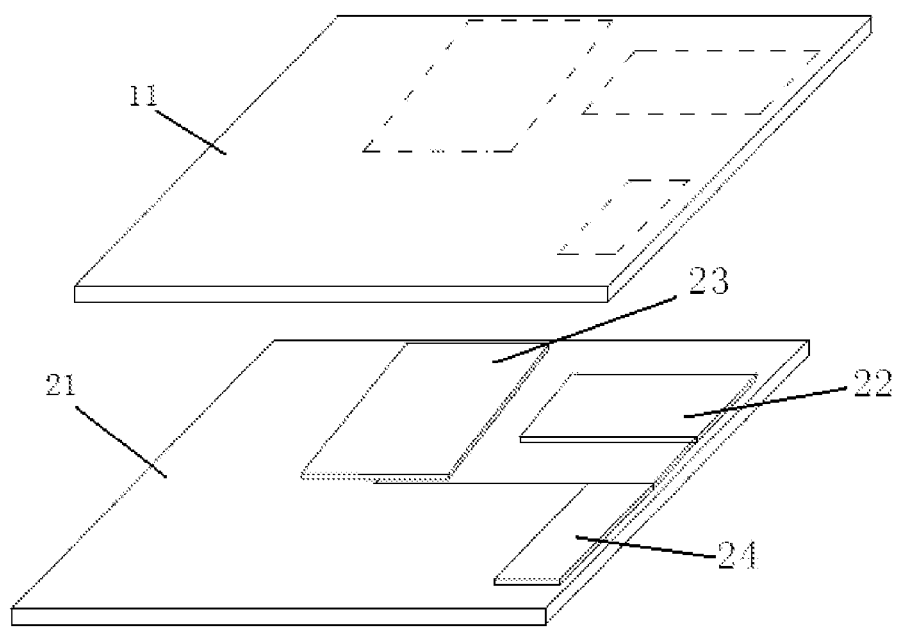
FIG. 4 is a structural schematic representation of a housing-closed card according to an embodiment of the present invention.

Firm and flexible connection should be formed among individual components of card inlay. ISO7816/7810 defines not only a layout of components of the intelligent card but also a requirement that the intelligent card shall have a bending resistance. FIG. 4 is a structural schematic representation of the housing-closed cards. In the FIG. 4, reference sign 11 refers to the upper housing, reference sign 21 refers to the lower housing, reference sign 23 refers to an area in the lower housing allocated for the battery as a card inlay, reference sign 24 refers to an area in the lower housing allocated for the button and flexible board as a card inlay. Place the individual card inlays in respective areas 22, 23 and 24 in the lower housing 21, each of which area has a profile in match with a respective card inlay, and then cover the lower housing 21 with the upper housing. Further, a flexible roller may be used to roll the housing-closed card, to make sure that a close contact is formed between the upper housing, the lower housing and the card inlay and bubbles can be avoided.

Step 4) after getting the housing-closed card, laminate the card at a middle range of temperature. Under traditional ways, laminating intelligent card is performed at high temperatures of 135° C. and at pressure of 5-6 MPa. In a preferred embodiment, the laminating process is performed at a middle temperature of 50-100° C. at a lower pressure of 2.5-5 MPa.

After the intelligent card has been finished, surface of the card may be printed. In ordinary ways of printing card, printing layer is not exposed directly, and the surface of the card has to be covered with a transparent protective film of 0.06-0.08 mm in thickness. This invention may adopt a new way of card printing, which is distinct from the ordinary printing in the prior art. By this new way, the printing can be done on the surface of card, resulting in a higher requirement for wear resistance. Universal transfer printing, heat transfer printing or water transfer printing can be used to finish the printing on the surface of card.

At last, perform remaining processes based on standards such as ISO7816 to finish stamping of letter, bonding of magnetic strip and fitting of contact IC to complete the whole process of card manufacturing.

It should be noted that preferred embodiments of the invention have been presented for purposes of illustration, and are not intended to be exhaustive or limited to the invention. Many modifications and variations will be apparent to those of ordinary skill in the art. However, these changes cannot be considered deviation from the spirit and scope of the present invention. Therefore, all obvious changes to those skilled in the art should be within the spirit and scope of the claims.

The invention claimed is:

1. A method of manufacturing a card, comprising the following steps:
   manufacturing a upper housing and a lower housing;
   coating an inner surface of at least one of the upper housing and the lower housing with a colloidal;
   placing one or more flexible inlays in either the coated upper housing or the coated lower housing, wherein said one or more flexible inlays have at least one different physical property from the upper housing and lower housing;
   closing the upper housing and the lower housing together to get a housing-closed card, wherein the colloidal completely fills into space between the upper housing and the lower housing, and wherein the colloidal operates to enhance affinity between the upper housing, lower housing and the one or more flexible inlays and forms firm and direct connection with close contact among individual components in the housing-closed card; and
   laminating the housings-closed card to have a finished card.

2. The method of claim 1, wherein there are one or more slots in match with the one or more inlays in the upper housing and in the lower housing; wherein the step of placing comprises placing each inlay in a respective slot of the upper housing or the lower housing.

3. The method of claim 2, wherein said step of manufacturing a upper housing and a lower housing comprises hot rolling sheet material of synthetic resin or plastic to make the slot, which is in match with the card inlay.

4. The method of claim 2, wherein said step of manufacturing a upper housing and a lower housing comprises milling sheet material of synthetic resin or plastic to make each slot in match with the respective card inlay.

5. The method of claim 2, wherein said step of manufacturing a upper housing and a lower housing comprises injection molding plastic material to make the slots of the upper housing and the lower housing in match with said card inlays.

6. The method of claim 5, wherein an exhaust steel material or a structure of sub-frame inlay is used in corresponding thin areas of plastic layer of said injection mold.

7. The method of claim 5, wherein said card comprises a battery and/or a display, and the battery and/or display is placed in said thin area of card plastic layer.

8. The method of claim 5, wherein said injection mold comprises a pneumatic structure of card ejection.

9. The method of claim 8, wherein said pneumatic structure of card ejection is air vent or funnel blowing structure.

10. The method of claim 1, wherein said step of coating comprises coating colloidal in uniformly spaced strip or jetting in dot on the inner surfaces of the upper housing and the lower housing.

11. The method of claim 1, wherein said step of coating comprises using a flexible roller to smooth out said colloidal.

12. The method of claim 11, wherein said step of coating comprises vacuuming the upper housing and the lower housing coated with colloidal after said step of smoothing out.

13. The method of claim 12, wherein said step of placing comprises closing the upper housing and the lower housing together, and rolling the same with a flexible roller to get a housing-closed card.

14. The method of claim 1, further comprising:
   avoiding damaging said one or more flexible inlays by configuring a temperature for said laminating to be within a range of 50-100° C. and a pressure for said laminating to be within a range of 2.5-5 MPa.

15. The method of claim 1, wherein said method comprises printing directly on the surface of said card after the step of laminating.

16. The method of claim 1, wherein each of said one or more inlays is a card inlay.

17. The method of claim 1, wherein the colloidal has a vitreous transition temperature of 35-70° C. and operates to be solidified by photo polymerization.

18. A method of manufacturing a card to perform steps comprising:
   manufacturing an upper housing and a lower housing by means of sheet material of synthetic resin or plastic;
   coating an inner surface of at least one of the upper housing and the lower housing with a colloidal, wherein the colloidal should have a vitreous transition temperature of 35-70° C. and can be solidified by photo polymerization;
   placing one or more flexible inlays in either the coated upper housing or the coated lower housing, wherein said one or more flexible inlays have at least one different physical property from the upper housing and lower housing;
   closing the upper housing and the lower housing together to get a housing-closed card, wherein the colloidal completely fills into space between the upper housing and the lower housing, and wherein the colloidal operates to enhance affinity between the upper housing, lower housing and the one or more flexible inlays and forms firm and direct connection with close contact among individual components in the housing-closed card; and
   laminating the housings-closed card at a temperature of 50-100° C. to have a finished card.

\* \* \* \* \*